United States Patent [19]

Shimada et al.

[11] Patent Number: 5,933,167
[45] Date of Patent: Aug. 3, 1999

[54] PRINTER HEAD FOR INK JET RECORDING

[75] Inventors: Masato Shimada; Kazumasa Hasegawa, both of Nagano, Japan

[73] Assignee: Seiko Epson Corporation, Tokyo, Japan

[21] Appl. No.: 08/627,065

[22] Filed: Apr. 3, 1996

[30] Foreign Application Priority Data

Apr. 3, 1995 [JP] Japan ........................... 7-077634
Jan. 19, 1996 [JP] Japan ........................... 8-007217

[51] Int. Cl.⁶ .......................................... B41J 0/45
[52] U.S. Cl. .................................................. 347/70
[58] Field of Search ....................... 347/68–72; 29/25.35, 29/890.1; 216/27; 252/62.9 PZ; 310/365

[56] References Cited

U.S. PATENT DOCUMENTS

| | | | |
|---|---|---|---|
| 5,265,315 | 11/1993 | Hoisington et al. | 347/68 X |
| 5,281,888 | 1/1994 | Takeuchi et al. | 310/366 |
| 5,530,465 | 6/1996 | Hasegawa et al. | 347/70 |
| 5,802,686 | 8/1998 | Shimada et al. | 29/25.35 |

FOREIGN PATENT DOCUMENTS

| | | |
|---|---|---|
| 0606767 | 12/1993 | European Pat. Off. . |
| 0636593 | 7/1994 | European Pat. Off. . |
| 736385 A1 | 10/1996 | European Pat. Off. ......... B41J 2/045 |
| 6-204580 | 7/1994 | Japan ............................. H01L 41/09 |

OTHER PUBLICATIONS

Vol. 94, No. 101 & JP–A–06 297720 (Seiko Epson Corp), Oct. 25, 1994 *abstract*.

Primary Examiner—Benjamin R. Fuller
Assistant Examiner—C Dickens
Attorney, Agent, or Firm—Sughrue, Mion, Zinn, Macpeak & Seas, PLLC

[57] ABSTRACT

A printer head for ink jet recording is disclosed, comprising a single-crystal silicon substrate pierced with holes, a zirconium oxide layer which is brought into direct contact with the surface of the silicon substrate or a silicon oxide layer on the surface of the silicon substrate so as to cover one end of the holes in the silicon substrate, a lower electrode provided on the zirconium oxide layer, a piezoelectric layer provided on the lower electrode, and an upper electrode provided on the piezoelectric layer. A process for the preparation of the above printer head for ink jet recording is also disclosed. The printer head for ink jet recording can support a piezoelectric substance having a high piezoelectricity, can exhibit a high head drive durability and can be produced in a high yield.

26 Claims, 6 Drawing Sheets

PRINTER HEAD FOR INK JET RECORDING

FIELD OF THE INVENTION

The present invention relates to a printer head for ink jet recording and a process for the preparation thereof. The printer head according to the present invention can be mounted on an ink jet recording apparatus.

As the method for energizing an ink housed in an ink chamber of a printer head for ink jet recording to be jetted there is normally used a method which comprises the use of a piezoelectric element to pressurize the interior of the ink chamber or a method which comprises the use of a heater to heat the ink in the ink chamber. The present invention concerns a printer head for ink jet recording having a means of pressurizing the interior of the ink chamber by a piezoelectric element.

BACKGROUND OF THE INVENTION

As a prior art technique involving the use of zirconium oxide as a piezoelectric/electrostriction type element there is disclosed a piezoelectric/electrostriction type element obtained by employing a film formation process to form a piezoelectric/electrostriction working part on a zirconium oxide substrate as a ceramic substrate at an area having a reduced thickness in JP-A-6-204580 (The term "JP-A" as used herein means an "unexamined published Japanese patent application"). The zirconium oxide to be used as a substrate for this element comprises at least one compound selected from the group consisting of yttrium oxide, cerium oxide, magnesium oxide and calcium oxide incorporated therein to have a fully or partially stabilized crystal phase. Further, since a ceramic substrate is used, the area having a reduced thickness has a relatively great dimension or thickness.

As a prior art technique involving the use of a single-crystal silicon as a substrate there is disclosed in U.S. Pat. No. 5,265,315 a printer head for ink jet recording having a laminated structure comprising a metal barrier layer made of platinum (Pt) or nickel (Ni), an aluminum oxide layer, a lower electrode, a binary lead zirconate titanate (PZT) layer, and an upper electrode provided on a single-crystal silicon substrate at an area having a reduced thickness. This printer head for ink jet recording comprises a binary PZT. Thus, heat treatment is effected at a temperature of from 600° C. to 650° C.

However, the printer heads for ink jet recording according to the foregoing prior art techniques have the following disadvantages.

The piezoelectric/electrostriction type element described in JP-A-6-204580 comprises a ceramic substrate. In the case where this piezoelectric/electrostriction type element is used to form a printer head for ink jet recording, it is difficult to reduce the dimension or thickness of the thinner portion formed by the ceramic substrate. In fact, the thinner portion of the element disclosed in the above cited patent has a dimension of 0.8 mm×3 mm and a thickness of 10 μm. The dimension of the thinner portion corresponds to the dimension of the ink chamber of the printer head for ink jet recording. In order to perform ink injection to a precision such that the density of nozzles on the printer head for ink jet recording is about 180 dpi, it is necessary that the thinner portion have a dimension of about 0.1 mm×4 mm and a thickness of about 1 μm. Accordingly, such a fine structure cannot be formed by the element described in the above cited patent. Further, since a ceramic substrate is expensive, the printer head for ink jet recording prepared from the element described in the above cited patent is expensive.

The printer head for ink jet recording described in the above cited U.S. Pat. No. 5,265,315 comprises a piezoelectric layer made of a binary PZT. Since this piezoelectric layer exhibits an insufficient piezoelectricity, no products having satisfactory ink jetting properties can be obtained. In order to further enhance the piezoelectricity of the piezoelectric layer, it is desirable to use a ternary PZT containing a third component in an amount of not less than 5 mol %. However, in order to provide this piezoelectric thin film with almost the same properties as PZT of bulk ceramics, it is necessary that the calcining temperature of PZT be raised to 800° C. However, if high temperature heat treatment is effected in the arrangement disclosed in the above cited U.S. patent, the vibrating plate portion can crack.

For the purpose of solving the foregoing problems, the inventors made extensive studies to develop an inexpensive durable printer head for ink jet recording having a smaller dimension and thickness of thinner portion which can be prepared without being subject to crack on the vibrating plate or the like even by a process which comprises high temperature heat treatment of a ternary PZT. As a result, it was found that by providing a zirconium oxide layer or metallic zirconium layer interposed between a single-crystal silicon substrate and a lower electrode in the preparation of a printer head for ink jet recording from the single-crystal silicon substrate, the stress applied to the single-crystal silicon substrate due to the difference between the volume change of the single-crystal silicon substrate and the volume change of the lower electrode (and the piezoelectric layer) with the temperature change from high temperature to room temperature and/or from room temperature to high temperature in the process for the preparation of the head can be reduced by the volume expansion of said zirconium oxide layer due to the crystalline phase transition or the oxidation of zirconium to zirconium oxide. Further, the printer head for ink jet recording thus obtained is novel itself. The adhesivity of the zirconium oxide layer to the single-crystal silicon substrate and the lower electrode is good, making it possible to support a piezoelectric layer having a high piezoelectricity. Further, the head drive durability can be enhanced.

The present invention has been worked out on the basis of this knowledge.

SUMMARY OF THE INVENTION

The present invention concerns a printer head for ink jet recording, comprising a single-crystal silicon substrate pierced with holes, a zirconium oxide layer which is brought into direct contact with the surface of said silicon substrate or a silicon oxide layer on the surface of said silicon substrate so as to cover one end of said holes in said silicon substrate, a lower electrode provided on said zirconium oxide layer, a piezoelectric layer provided on said lower electrode, and an upper electrode provided on said piezoelectric layer.

The present invention also concerns a process for the preparation of a printer head for ink jet recording comprising a single-crystal silicon substrate pierced with holes, a zirconium oxide layer which is brought into direct contact with the surface of said silicon substrate or a silicon oxide layer on the surface of said silicon substrate so as to cover one end of said holes in said silicon substrate, a lower electrode provided on said zirconium oxide layer, a piezoelectric layer provided on said lower electrode, and an upper electrode provided on said piezoelectric layer, which comprises reducing the stress applied to said single-crystal silicon substrate due to the difference between the volume change of said single-crystal silicon substrate and the volume change of said lower electrode and said piezoelectric layer with the temperature change from high temperature to room temperature in the preparation process by the volume expansion of said zirconium oxide layer due to the crystalline phase transition or the oxidation of zirconium to zirconium oxide.

BRIEF DESCRIPTION OF THE DRAWINGS

FIG. 1 (b) is an enlarged sectional view taken along the line A-A' of FIG. 1 (a);

FIG. 3(a) is a schematic perspective view illustrating another embodiment of the printer head for ink jet recording according to the present invention.

DETAILED DESCRIPTION OF THE INVENTION

In the process for the preparation of the printer head for ink jet recording according to the present invention, (1) the volume expansion due to the crystal phase transition of the zirconium oxide layer provided interposed between the single-crystal substrate and the lower electrode and/or (2) the volume expansion due to the oxidation of zirconium to zirconium oxide in the metallic zirconium layer provided interposed between the single-crystal silicon substrate and the lower electrode can be utilized.

Firstly, the foregoing method (1) which comprises the utilization of the volume expansion due to the crystal phase transition will be described with reference to the accompanying drawings.

Figure 1:
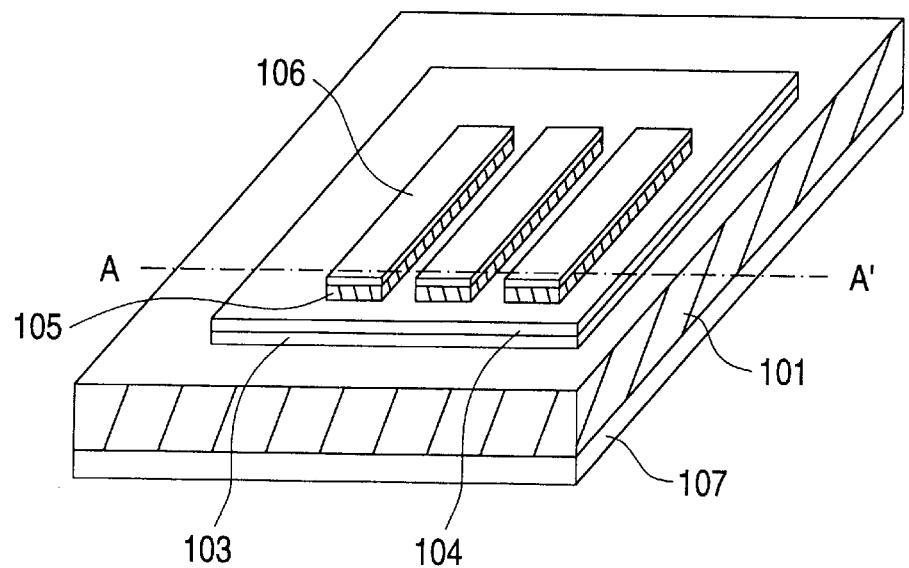
FIG. 1 (a) is a schematic perspective view illustrating an embodiment of the printer head for ink jet recording according to the present invention.
Figure 1:
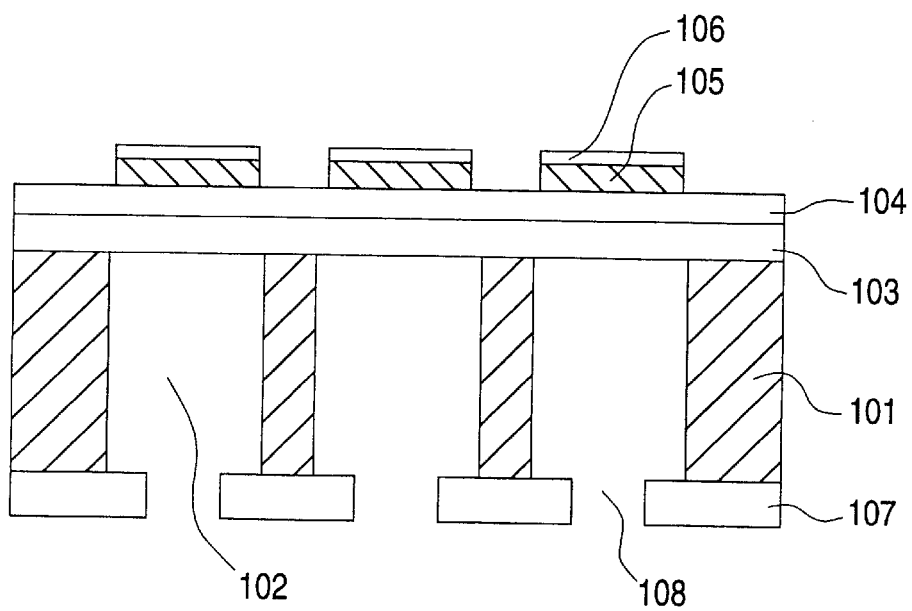

FIG. 1 typically illustrates an embodiment of the printer head for ink jet recording according to the present invention. FIG. 1 (a) is a schematic perspective view of the printer head for ink jet recording according to the present invention. FIG. 1 (b) is an enlarged sectional view taken along the line A-A' of FIG. 1 (a).

The printer head for ink jet recording of the present invention shown in FIG. 1 comprises a single-crystal silicon substrate 101 having a plurality of ink chambers 102; a zirconium oxide layer 103 provided on the single-crystal silicon layer 101 to form the bottom of the ink chambers 102; a piezoelectric element comprising a lower electrode 104 formed on the zirconium oxide layer 103, a piezoelectric layer 105 formed on the lower electrode 104 and an upper electrode 106 formed on the piezoelectric layer 105; and a nozzle plate 107 forming nozzles 108 fused together.

The ink chambers 102 and nozzles 108 are arranged at a constant pitch.

Referring briefly to the operation of the foregoing printer head for ink jet recording, a voltage is applied across the lower electrode 104 and the upper electrode 106 to deform the piezoelectric element comprising the lower electrode 104, the piezoelectric layer 105 and the upper electrode 106 and the zirconium oxide layer 103 and hence reduce the volume of the ink chambers 102, making it possible to jet the ink loaded in the ink chambers 102 through the nozzles 108.

Figure 2:
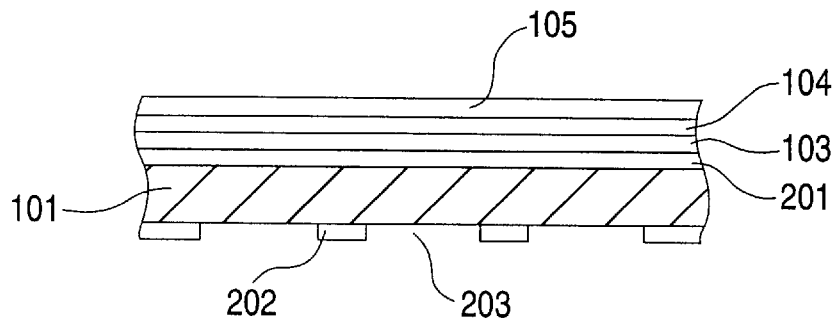
FIG. 2(a), 2(b) and 2(c) are sectional views illustrating the process for the preparation of an embodiment of the printer head for ink jet recording according to the present invention.
Figure 2:
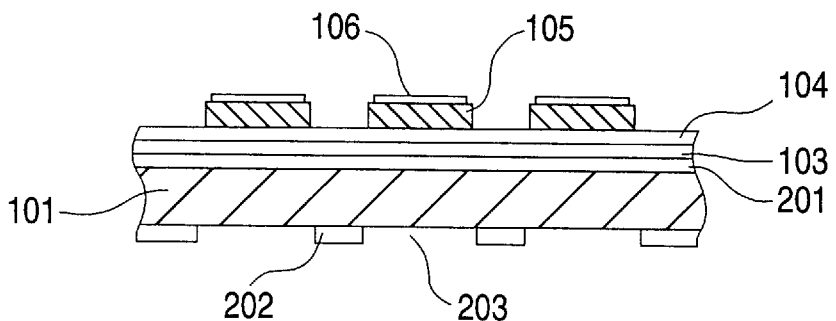
Figure 2:
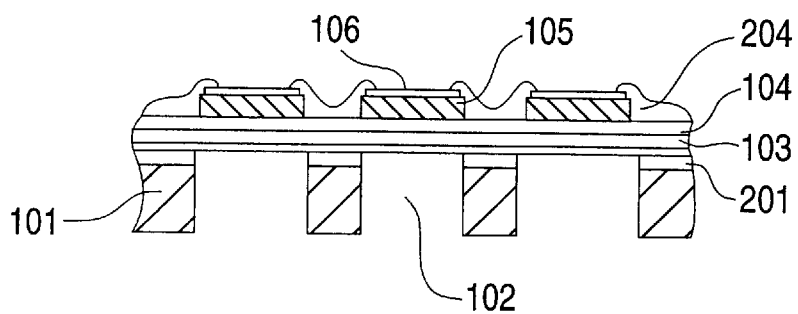

FIG. 2 is a sectional view illustrating a typical process for the preparation of a printer head for ink jet recording of the present invention involving the steps (a) to (c) of forming a piezoelectric element and ink chambers 102 on a single-crystal silicon substrate 101 by utilizing the volume expansion due to the foregoing crystal phase transition. In this sectional view, the direction perpendicular to the paper corresponds to the direction of the length of the ink chambers.

Firstly, a single-crystal silicon substrate 101 having (110) plane is subjected to wet thermal oxidation at a temperature of from 1,000° C. to 1,200° C. to form silicon dioxide layers 201 and 202 on both sides thereof, respectively. The silicon dioxide layer can also be formed by CVD (chemical vapor deposition method). The thickness of the silicon dioxide layers 201 and 202 are not specifically limited but are preferably from 2,000 to 10,000 Å. The silicon dioxide layer 201, which acts as an etching stop layer, preferably has a thickness of not less than 2,000 Å taking into account overetching. The thickness of the silicon dioxide layer 202, which acts as an etching mask, varies with the thickness of the silicon substrate but is preferably from 6,000 to 10,000 Å.

A zirconium oxide layer 103 described later may be formed directly on the single-crystal silicon substrate 101 without previously oxidizing the single-crystal silicon substrate 101. Alternatively, the zirconium oxide layer 103 may be formed directly on the single-crystal silicon substrate 101 after the silicon dioxide layer 201 which has once been formed is etched away.

Subsequently, a photoresist is formed on the silicon dioxide layer 202 to provide an opening area. The silicon dioxide layer 202 is then subjected to patterning with an etching solution (e.g., aqueous solution of hydrofluoric acid and ammonium fluoride) to form an opening area 203. In this process, the direction of the depth of the opening area 203, i.e., direction perpendicular to the paper is arranged to correspond to $<1\bar{1}2>$ or $<\bar{1}12>$ direction of the single-crystal silicon substrate 101. After peeling the photoresist, a zirconium oxide layer 103 is formed on the silicon dioxide layer 201 side of the silicon substrate 101 by a thin film formation process. The thickness of the zirconium oxide layer 103 is not specifically limited but is preferably from 0.1 to 2 μm. The upper limit of the thickness of the zirconium oxide layer 103 is determined by the upper limit of residual stress developed after heat treatment effected shortly after the formation of the zirconium oxide layer 103. The lower limit of the thickness of the zirconium oxide layer 103 is determined by the upper limit of residual stress developed after heat treatment of the piezoelectric layer.

The term "thin film formation process" as used herein is not meant to indicate any specific method so far as it is a thin film formation process commonly used in the production of an electronics device such as printer head for ink jet recording. Specific examples of such a thin film formation process include sputtering process, sol-gel process, CVD process, vacuum evaporation process, and hydrothermal process.

The foregoing zirconium oxide layer 103 is preferably formed, e.g., by a rf-magnetron sputtering process with a sintered zirconium oxide as a sputtering target. Subsequently, the zirconium oxide layer 103 thus formed is subjected to heat treatment at a temperature of 1,050° C. to 1,200° C. in an atmosphere containing oxygen (particularly air) for 30 minutes to 2 hours. The bending of the substrate supporting the zirconium oxide layer is then measured at room temperature. The residual stress is then calculated from this bending. As a result, the single-crystal silicon substrate is found to receive a stress as small as 0.5 to $3 \times 10^{-8}$ $N/m^2$ from the zirconium oxide layer.

Besides the sputtering process employing a sintered zirconium oxide as a target, a process which comprises sputtering in an oxygen atmosphere with a metallic zirconium target may be used to form a zirconium oxide layer. Further, sol-gel process or CVD process may be used to form a zirconium oxide layer.

The zirconium oxide layer 103 is formed by an unstabilized zirconium oxide substantially free of stabilizer so that the crystal structure thereof stays monoclinic at room temperature. Zirconium oxide is stabilized when it comprises a stabilizer such as magnesium oxide, calcium oxide, yttrium oxide or cerium oxide incorporated therein in the form of solid solution in an amount of not less than 1 mol %. The process of the present invention utilizing the volume expansion due to the crystal phase transition employs a so-called non-stabilized zirconium oxide (zirconia) rather than so-called stabilized or partially-stabilized zirconium oxide.

Subsequently, a lower electrode 104 and a piezoelectric layer 105 were laminated on the zirconium oxide layer 103 by a thin-film formation process. A section of the laminated material thus obtained is shown in FIG. 2 (*a*).

The material of the lower electrode 104 is not specifically limited so far as it is commonly used as an electrode, particularly lower electrode, in the production of an electronics device such as printer head for ink jet recording. It is preferably a stable high melting metal which is little reactive to the temperature of heat treatment of the piezoelectric substance (e.g., PZT) to be formed on the lower electrode. In some detail, it is preferably made of a material comprising platinum or palladium as a main component. The term "as a main component" as used herein is meant to indicate that the content of platinum or palladium is not less than 50% by weight, preferably not less than 80% by weight. The thickness of the lower electrode is not specifically limited but is preferably from 1,000 to 10,000 Å. The thickness of the lower electrode is preferably not less than 1,000 Å from the standpoint of sheet resistance. If the thickness of the lower electrode exceeds 10,000 Å, an excessive stress can be disadvantageously applied to the silicon substrate.

Though not shown in FIG. 2, a metal layer made of titanium, tantalum, aluminum, tin, iridium or mixture thereof is preferably formed as an adhesion layer between the zirconium oxide layer 103 and the lower electrode 104 by a thin-film formation process to enhance the adhesivity between the zirconium oxide layer 103 and the lower electrode 104. The thickness of the metal layer as adhesion layer is not specifically limited but is preferably from 50 to 1,000 Å.

The titanium layer as adhesion layer and the platinum layer as lower electrode 104 can be sequentially formed by a d.c. sputtering process.

Further, a piezoelectric layer 105 is then formed on the lower electrode 104. In order to form the piezoelectric layer 105, a precursor layer is formed by any one of various thin-film formation processes. Subsequently, the crystallization temperature and the treatment time are properly selected depending on the thin-film formation process used. The material is then subjected to heat treatment under these conditions to convert the precursor to a piezoelectric substance.

For example, if a sputtering process is used to form a precursor layer, some heat treatment is effected depending on the composition of the precursor. For example, a rapid heating process employing a lamp annealing apparatus (e.g., combination of a first heat treatment for crystallization at 500° C. to 700° C. for 1 to 5 minutes and a second heat treatment for enhancement of properties at 650° C. to 900° C. for 1 to 5 minutes) or a heat treatment process by a diffusion furnace commonly used in the preparation of semiconductors which proceeds at a not so particularly rapid rate (e.g., combination of a first heat treatment for crystallization at 500° C. to 700° C. for 10 minutes to 3 hours and a second heat treatment for enhancement of properties at 650° C. to 900° C. for 10 minutes to 3 hours) may be mostly used to convert the precursor to the piezoelectric substance.

If a sol-gel process is used to form a precursor layer, the heat treatment conditions are changed depending on the composition of the starting material of sol. In general, a rapid heating process employing a lamp annealing apparatus (e.g., combination of a first heat treatment for seed crystal formation at 500° C. to 700° C. for 1 to 5 minutes and a second heat treatment for crystal growth and enhancement of properties at 650° C. to 950° C. for 1 to 5 minutes) may be used. In the case of hydrothermal process, a piezoelectric layer is obtained during the formation of film.

The piezoelectric substance employable herein is not specifically limited. A ternary PZT (lead zirconate titanate) is preferred because it can provide a piezoelectric substance having a high piezoelectricity. For example, a ternary PZT (lead zirconate titanate) represented by the following general formula (1) is preferred:

$$Pb_{1+x}[(Zr)_a(Ti)_b(B_dB'_e)_c]O_{3+x} \qquad (1)$$

wherein (B and B') represents a combination of a divalent metal ion and a pentavalent metal ion, a combination of a divalent metal ion and a hexavalent metal ion or a combination of a trivalent metal ion and a pentavalent metal ion; and x, a, b, c, d and e satisfy the following relationships:

$0 \leq x \leq 0.3,$ $0.25 \leq a \leq 0.55,$ $0.35 \leq b \leq 0.55,$ $0.05 \leq c \leq 0.04,$ with the proviso that if (B and B') is a combination of a divalent metal ion and a pentavalent metal ion, the following relationships are satisfied:

$0.31 < d < 0.35,$ $0.63 < e < 0.7,$ $0.94 < d+e < 1.05,$ or if (B+B') is a combination of a trivalent metal ion and a pentavalent metal ion or a combination of a divalent metal ion and a hexavalent metal ion, the following relationships are satisfied:

$0.47 < d < 0.53$, $0.47 < e < 0.53$, $0.94 < d+e < 1.06$

In the foregoing general formula (1), the divalent metal ion B is magnesium (Mg), cobalt (Co), zinc (Zn), cadmium (Cd), Manganese (Mn) or nickel (Ni). The trivalent metal ion B is yttrium (Y), iron (Fe), scandium (Sc), ytterbium (Yb), lutetium (Lu), indium (In) or chromium (Cr). The pentavalent metal ion B' is niobium (Nb), tantalum (Ta) or antimony (Sb). The hexavalent metal ion B' is tungsten (W) or tellurium (Te). In order to enhance the ink jetting properties of the printer head for ink jet recording, a ternary PZT which comprises third components, i.e., B and B' in the general formula (1) preferably in an amount of not less than 5 mol %, more preferably from 5 to 40 mol % to exhibit a high electrostriction constant may be used.

The thickness of the piezoelectric layer 105 is not specifically limited but is preferably from 0.5 to 5 μm. If a metal layer is formed as an adhesion layer between the zirconium oxide layer 103 and the lower electrode 104, the foregoing metal is simultaneously oxidized during the heat treatment of the piezoelectric precursor.

In the case of using a ternary PZT containing a third component in an amount of not less than 5 mol %, the piezoelectric substance having higher piezoelectricity can be obtained when the above-described heat treatment temperature in an atmosphere containing oxygen (for crystal growth and/or enhancement of piezoelectricity) is set at a range of from 700 to 900° C., preferably at 800° C.

Subsequently, the piezoelectric layer 105 is patternwise etched with an etching solution (e.g., aqueous solution of hydrofluoric acid). The lower electrode 104 is patternwise etched with an etching solution (e.g., aqueous solution of aqua regia). Thereafter, an upper electrode 106 is formed on the piezoelectric layer 105 by a thin-film formation process.

The material of the upper electrode 106 is not specifically limited so far as it is commonly used as an electrode, particularly upper electrode, in the production of electronics devices such as printer head for ink jet recording. In some detail, it is preferably made of gold, platinum or aluminum. The thickness of the upper electrode is not specifically limited but is preferably from 500 to 5,000 Å.

Though not shown in FIG. 2, an adhesion layer, e.g., titanium layer is preferably formed between the piezoelectric layer 105 and the upper electrode 106 by a thin-film formation process to enhance the adhesivity between the piezoelectric layer 105 and the upper electrode 106. The thickness of the metal layer as adhesion layer is not specifically limited but is preferably from 50 to 300 Å. After the formation of the upper electrode, a sufficient adhesivity can be obtained without the need of high temperature treatment. Accordingly, the foregoing titanium layer doesn't need to be oxidized.

The metal layer as adhesion layer and the upper electrode 106 are sequentially formed by a sputtering process, and then patternwise etched with an etching solution (e.g., aqueous solution containing iodine and potassium iodide). The structure of the laminated material obtained by patternwise etching the upper electrode 106 formed on the piezoelectric layer 105 is shown in FIG. 2 (b). Alternatively, an ion milling process using an inert gas may be employed to obtain the similar laminated material.

Thereafter, as shown in FIG. 2 (c), a photosensitive monomer layer for the formation of polyimide is formed as a protective layer 204 for the piezoelectric layer 105 to a thickness of from 0.3 to 5 μm. The protective layer on the upper electrode 106 is then removed by development. The laminated material is then subjected to heat treatment at a temperature of from 300° C. to 450° C. to form a polyimide layer.

Using a fixture which allows the laminated material to be brought into contact with an etching solution only at the silicon substrate side thereof opposite the piezoelectric element side on which the protective layer 204 has been formed, the laminated material is then dipped in an anisotropic etching solution (e.g., 10 to 40% aqueous solution of potassium hydroxide) at a temperature of from 70° C. to 90° C. to effect an anisotropic etching on the single-crystal silicon substrate 101 at the opening area 203 formed on the silicon dioxide layer 202. Thus, ink chambers 102 are formed. This etching process is arranged such that the face orientation of the single-crystal silicon substrate 101 is (110) and the direction of the length of the opening area 203 is <1$\overline{1}$2> or <$\overline{1}$12> direction. Accordingly, the side wall forming the sides in the length direction of the ink chambers 102 corresponds to (111) plane.

If an aqueous solution of potassium hydroxide is used as an anisotropic etching solution, the ratio of the etching rate on (110) plane to on (111) plane of the single-crystal silicon is about 300:1. Accordingly, the degree of side etching on grooves having a depth of 250 μm in the single-crystal silicon substrate 101 can be restricted to about 1 μm, making it possible to form ink chambers 102 to a high precision.

Subsequently, the exposed area of the silicon dioxide layers 202 and 201 is etched away with an etching solution (e.g., aqueous solution of hydrofluoric acid and ammonium fluoride) with the single-crystal silicon substrate 101 kept fixed to the foregoing fixture.

In this etching process, the zirconium oxide layer 103 is useful as an etching stop layer for the silicon dioxide layer 201 during the formation of the ink chambers 102. The yield can be drastically enhanced as compared with the absence of zirconium oxide layer 103.

Further, the non-stabilized zirconium oxide has a higher Young's modulus than zirconium oxide stabilized with magnesium oxide or yttrium oxide. Thus, the non-stabilized zirconium oxide can provide enhanced ink jetting properties.

It is known that pure zirconium oxide (zirconia) changes its crystal structure with temperature. In some detail, pure zirconium oxide stays monoclinic (also referred to as hexagonal) at a temperature ranging from room temperature to about 1,000° C., tetragonal at a temperature ranging from not lower than about 1,000° C. to not higher than about 1,900° C. and cubic at a temperature ranging from not lower than about 1,900° C. to not higher than about 2,700° C. (melting point). Accordingly, the heat treatment (at 1,050° C. to 1,200° C.) after the formation of the zirconium oxide layer according to the present invention causes the crystal system to change from monoclinic to tetragonal from before to after the formation of the adhesion layer or lower electrode.

The tetragonal zirconium oxide has a volume of about 3% smaller than that of the monoclinic zirconium oxide. Accordingly, it has been already known that if heat treatment is effected across the monoclinic/tetragonal transition temperature, the resulting volume change is hysteretic with respect to the heat treatment temperature, causing cracking on the crystalline zirconium oxide. In other words, if zirconium oxide as a bulk ceramics is given a heat cycle that causes the crystal structure to be changed, the volume shrinkage accompanies cracking, making it impossible to obtain usable products. Thus, a bulk ceramics normally comprises magnesium oxide, calcium oxide, yttrium oxide, cerium oxide or the like incorporated therein in the form of solid solution in an amount of from 1 mol % to 30 mol % so as to occur always as a high temperature type cubic system. With this composition, a stabilized zirconia which stays cubic at room temperature can be obtained.

However, if a thin zirconium oxide layer is formed on the single-crystal silicon substrate as in the present invention, the volume expansion energy of the zirconium oxide is absorbed by the bending of the silicon substrate, making it possible to prevent the cracking of the zirconium oxide layer. In other words, non-stabilized zirconium oxide undergoes crystal phase transition to monoclinic system and hence volume expansion when cooled from a temperature of not lower than 1,000° C. where it stays in the form of thermally stable tetragonal system. Thus, the single-crystal silicon substrate is subjected to tensile stress from the zirconium oxide layer. On the other hand, stabilized zirconia undergoes no crystal phase transition when cooled from a temperature as high as not lower than 1,000° C. Thus, the single-crystal silicon substrate is subjected to strong compression stress depending only on thermal expansion coefficient (stabilized zirconia has a higher thermal expansion coefficient than silicon). In the process for the formation of a thin piezoelectric layer, in order to crystallize the piezoelectric layer to obtain a high piezoelectricity, heat treatment at a temperature of not lower than 800° C. is indispensable. However, since the thermal expansion coefficient of the lower electrode and piezoelectric layer is greater than that of the single-crystal silicon substrate, the single-crystal silicon substrate is subjected to strong compression stress when cooled from high temperatures regardless of whether or not the stabilized zirconia layer is used.

The present invention utilizes the foregoing principle. The interposition of a so-called non-stabilized zirconium oxide layer between the single-crystal silicon substrate and the lower electrode can reduce the residual stress applied to the single-crystal silicon substrate after the formation of the piezoelectric element and makes it possible to use the zirconium oxide layer formed in the product as a vibrating plate material.

In general, in the process for the preparation of a printer head for ink jet recording, various heat treatments are effected as mentioned above. Thus, the silicon substrate and the entire layer structure (upper electrode, piezoelectric layer and lower electrode vibrating plate) are subjected to strong mutual stress due to the difference in thermal expansion coefficient between them. If the residual stress in the entire layer structure is great, it is disadvantageous in that if the silicon substrate is etched during the formation of ink chambers, the vibrating plate portion is subjected to great stress change that causes destruction in the vibrating plate portion. However, in the present invention, the residual stress in the entire layer structure is small, making it possible to prevent defects due to stress destruction in the vibrating plate portion (zirconium oxide layer) even during the formation of ink chambers.

Further, the printer head for ink jet recording is normally subject to stress change in the vibrating plate portion because the vibrating plate portion is allowed to vibrate during the jetting of ink. In this process, if a high residual stress occurs in the vibrating plate portion, the residual stress and the stress developed during the jetting of ink can exceed the limit of breaking stress of the layer, reducing the durability of the printer head. However, since the printer head for ink jet recording according to the present invention is less apt to residual stress, the durability of the driving portion including the zirconium oxide layer against displacement operation can be drastically enhanced.

As mentioned above, the printer head for ink jet recording of the present invention can be prepared by a process which comprises, after the formation of a zirconium oxide layer, subjecting the material to heat treatment at a temperature higher than the temperature where the crystal structure of the foregoing zirconium oxide layer changes from monoclinic system to tetragonal system (preferably not lower than 1,050° C., more preferably not lower than 1,150° C.). However, as mentioned later, the printer head for ink jet recording of the present invention can also be prepared by a process which comprises a step of forming a metallic zirconium layer, and a step of oxidizing the metallic zirconium layer in an atmosphere containing oxygen at a temperature higher than the temperature where the crystal structure of the foregoing zirconium oxide layer is changed from monoclinic system to tetragonal system (preferably not lower than 1,050° C., more preferably not lower than 1,150° C.) to convert the metallic zirconium layer to the zirconium oxide layer. In the latter case, oxidation reaction allows the formation of a zirconium oxide layer. Accordingly, a dense layer having little pin holes can be obtained. At the same time, the volume expansion due to crystal phase transition as well as the volume expansion due to the conversion of metallic zirconium to zirconium oxide can be utilized in the preparation process.

The printer head for ink jet recording of the present invention thus obtained comprises a single-crystal silicon substrate pierced with holes; a zirconium oxide layer (preferably having a thickness of from 0.1 to 2 μm) which is brought into direct contact with the surface of said silicon substrate or a silicon oxide layer on the surface of said silicon substrate so as to cover one end of said holes in said silicon substrate; a lower electrode (preferably having a thickness of from 1,000 to 10,000 Å) provided on said zirconium oxide layer; optionally an adhesion layer (preferably having a thickness of from 0 to 1,000 Å) provided interposed between said zirconium oxide layer and said lower electrode; a piezoelectric layer (preferably having a thickness of from 0.5 to 5 μm) provided on said lower electrode; an upper electrode (preferably having a thickness of from 500 to 5,000 Å) provided on said piezoelectric layer; and optionally an adhesion layer (preferably having a thickness of from 0 to 300 Å) provided interposed between said piezoelectric layer and said upper electrode, wherein the crystal structure of said zirconium oxide layer stays monoclinic at room temperature. The foregoing relatively thick monoclinic zirconium oxide layer acts as a vibrating plate.

In the printer head for ink jet recording according to the present invention, it is preferred that the thickness of the foregoing lower electrode be greater than that of the foregoing monoclinic zirconium oxide layer. In other words, if the ratio of the two layers (thickness of monoclinic zirconium oxide layer/thickness of lower electrode) is not less than 1 (particularly from 1 to 10), the residual stress occurring on the single-crystal silicon substrate before the formation of ink chambers, the yield in the production of vibrating plate and the durability of the head drive can be enhanced for the same reasons as mentioned above.

Further, in the printer head for ink jet recording according to the present invention, the average crystal grain diameter of the zirconium oxide constituting the foregoing monoclinic zirconium oxide layer is preferably from 500 to 3,000 Å. If the average crystal grain diameter of the zirconium oxide falls within the above defined range, the durability of the head drive can be enhanced. The average crystal grain diameter of the zirconium oxide can be properly controlled by changing the heat treatment temperature, the heat treatment time, and/or atmospheric gas in which the heat treatment is effected.

The process for the preparation of the printer head for ink jet recording according to the present invention utilizing the volume expansion due to the oxidation of zirconium to zirconium oxide in the metallic zirconium layer provided interposed between the single-crystal silicon substrate and the lower electrode will be further described in connection with the accompanying drawings.

Figure 3:
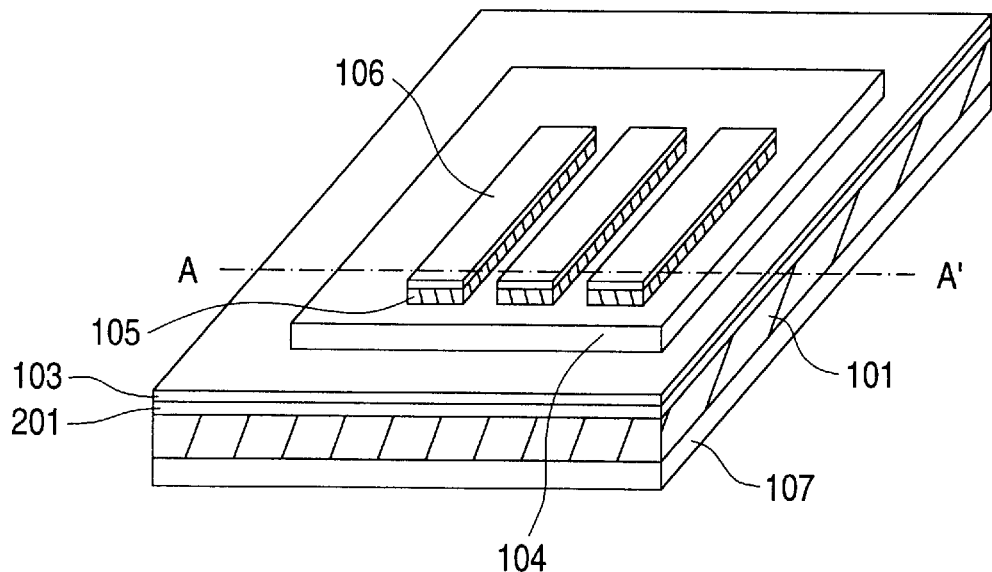
FIG. 3 (b) is an enlarged sectional view taken along the line A-A' of FIG. 3 (a)
Figure 3:
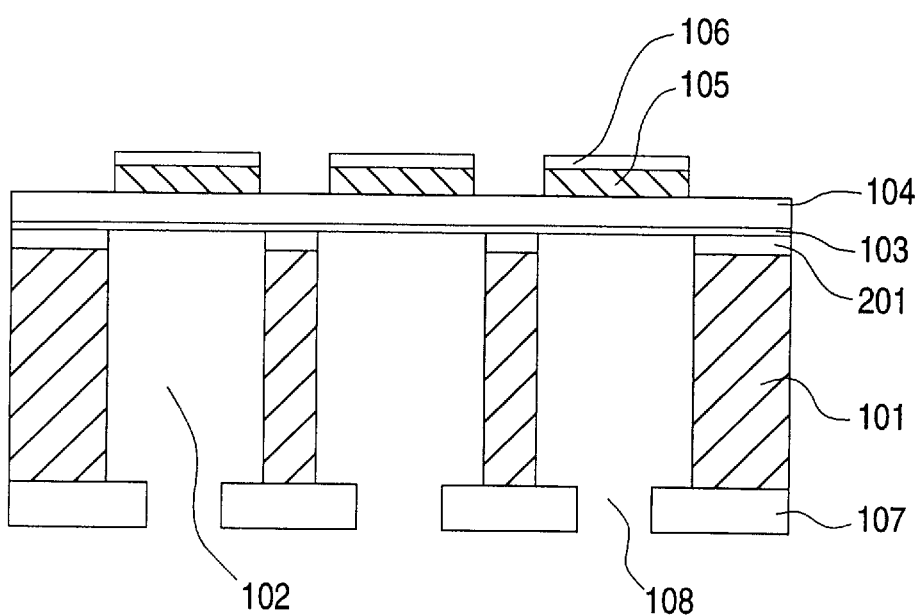

FIG. 3 typically illustrates an embodiment of the printer head for ink jet recording according to the present invention. FIG. 3 (a) is a schematic perspective view of the printer head for ink jet recording according to the present invention. FIG. 3 (b) is an enlarged sectional view taken along the line A-A' of FIG. 3 (a).

The printer head for ink jet recording of the present invention shown in FIG. 3, too, comprises a single-crystal silicon substrate 101 having a plurality of ink chambers 102; a silicon dioxide layer 201 formed on the single-crystal silicon layer 101; a zirconium oxide layer 103 provided on the silicon dioxide layer 201 to form the bottom of the ink chambers 102; a piezoelectric element comprising a lower electrode 104 formed on the zirconium oxide layer 103, a piezoelectric layer 105 formed on the lower electrode 104 and an upper electrode 106 formed on the piezoelectric layer 105; and a nozzle plate 107 forming nozzles 108 fused together. The ink chambers 102 and nozzles 108 are arranged at a constant pitch.

Referring briefly to the operation of the foregoing printer head for ink jet recording, a voltage is applied across the lower electrode 104 and the upper electrode 106 to deform the piezoelectric element comprising the lower electrode 104, the piezoelectric layer 105 and the upper electrode 106 and the zirconium oxide layer 103 and hence reduce the volume of the ink chambers 102, making it possible to jet the ink loaded in the ink chambers 102 through the nozzles 108.

Figure 4:
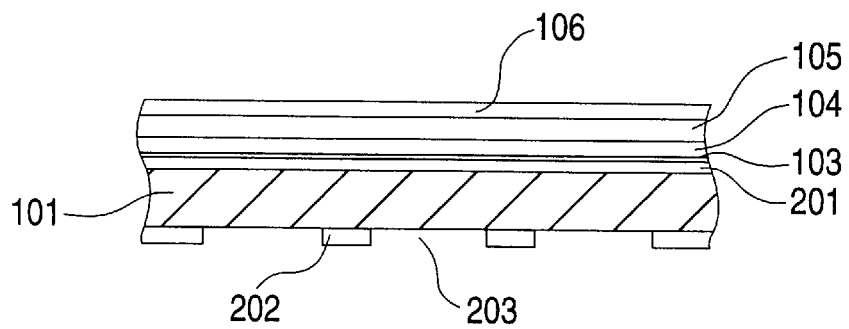
FIGS. 4(a), 4(b) and 4(c) are sectional views illustrating the process for the preparation of the printer head for ink jet recording according to the present invention shown in FIGS. 3(a) and (b)
Figure 4:
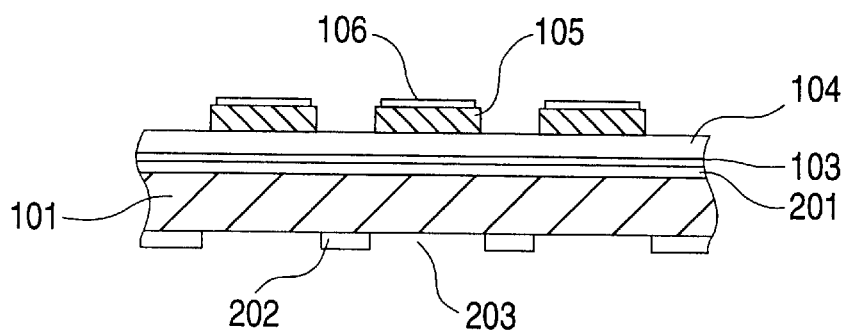
Figure 4:
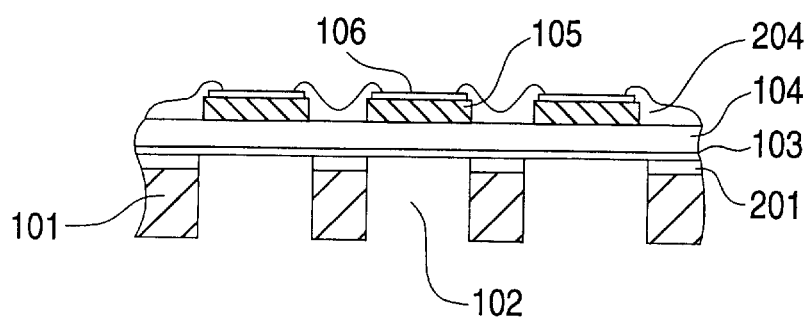

FIG. 4 is a sectional view illustrating a typical process for the preparation of a printer head for ink jet recording of the present invention involving the steps (a) to (c) of forming a piezoelectric element and ink chambers 102 on a single-crystal silicon substrate 101 by utilizing the volume expansion due to the oxidation of metallic zirconium to zirconium oxide. In this sectional view, the direction perpendicular to the paper corresponds to the direction of the length of the ink chambers.

Firstly, a single-crystal silicon substrate 101 having (110) plane is subjected to wet thermal oxidation at a temperature of from 1,000° C. to 1,200° C. or CVD to form silicon dioxide layers 201 and 202 on both sides thereof, respectively. The thickness of the silicon dioxide layers 201 and 202 is not specifically limited but is preferably from 4,000 to 10,000 Å similarly to the case as mentioned above. A metallic zirconium layer 103 described later may be formed directly on the single-crystal silicon substrate 101 without previously oxidizing the single-crystal silicon substrate 101. Alternatively, a zirconium oxide layer 103 described later may be formed directly on the single-crystal silicon substrate 101 after the silicon dioxide layer 201 which has once been formed is removed by etching or the like.

Subsequently, a photoresist is formed on both sides of the silicon dioxide layers 201 and 202 by an ordinary photolithographic process to form a desired pattern on the photoresist on the silicon dioxide layer 202.

The substrate thus obtained is then dipped in an etching solution (e.g., aqueous solution containing hydrofluoric acid and ammonium fluoride) so that the silicon dioxide layer 202 is patternwise etched to form an opening area 203. In this process, the direction of the length of the opening area 203, i.e., the direction perpendicular to the paper corresponds to <1$\bar{1}$2> or <$\bar{1}$12> direction of the single-crystal silicon substrate 101.

The substrate thus obtained is then dipped in a stripping agent (e.g., sulfuric acid) at a temperature of from 80° C. to 90° C. to peel the photoresist off the substrate. A metallic zirconium layer 103 is then formed on the silicon dioxide layer 201 side of the substrate by a thin-film formation process, particularly d.c. sputtering process. The thickness of the metallic zirconium layer is not specifically limited so far as the volume expansion due to the conversion of metallic zirconium to zirconium oxide conforms to the objects of the present invention. In particular, if the process for the oxidation of metallic zirconium to zirconium oxide is effected before the formation of piezoelectric layer, the thickness of the metallic zirconium layer is not restricted. On the other hand, if the process for the oxidation of metallic zirconium to zirconium oxide is not effected before the effectuation of the process for the conversion of piezoelectric precursor to piezoelectric substance, the thickness of the metallic zirconium layer is preferably from about 50 Å to about 300 Å. The present invention will be further described hereinafter with reference to the latter case.

After the formation of the metallic zirconium layer 103, a lower electrode 104 is formed by a thin-film formation process, particularly d.c. sputtering process. The thickness of the lower electrode is not specifically limited but is preferably from 0.2 to 2 μm.

Though not shown in FIG. 4, in some cases, a metal layer for adhesion as mentioned above may be provided interposed between the metallic zirconium layer 103 and the lower electrode 104 by a thin-film formation process to enhance the adhesivity between the zirconium oxide layer 103 formed by the oxidation of the metallic zirconium layer and the lower electrode 104.

Subsequently, a piezoelectric precursor layer is laminated on the lower electrode 104. This precursor layer is formed by a thin-film formation process as mentioned above. The precursor layer may be then subjected to heat treatment under crystallization temperature and processing time conditions which are properly adjusted according to the thin-film formation process used. Thus, the precursor layer may be converted to a piezoelectric layer 105.

On the other hand, in the foregoing heat treatment, the metallic zirconium layer 103 is oxidized to a zirconium oxide layer 103 whose thickness is as about twice as that of the metallic zirconium layer 103. If heat treatment is effected in the same manner as above in the absence of metallic zirconium layer 103, the lower electrode 104 is peeled off the silicon dioxide layer 201 during this heat treatment. Further, if heat treatment is effected in the same manner as above in the presence of a metallic titanium layer instead of metallic zirconium layer 103, lead diffused from PZT, if PZT is used as a piezoelectric substance, causes the silicon dioxide layer 201 to be melted, causing the lower electrode to be partly peeled off. Accordingly, the zirconium oxide layer 103 acts as an adhesion layer for bonding the lower electrode 104 to the silicon dioxide layer 201. It also acts as a lead diffusion preventive layer. If a metal layer as adhesion layer is provided interposed between the metallic zirconium layer 103 and the lower electrode 104, it is oxidized, too, during the heat treatment.

Subsequently, an upper electrode 106 is formed on the piezoelectric layer 105 by a thin-film formation process. The thickness of the upper electrode 106 is not specifically limited but is preferably from 500 to 5,000 Å.

Though not shown in FIG. 4, in some cases, a metal layer as adhesion layer may be provided interposed between the piezoelectric layer 105 and the upper electrode 106 to enhance the adhesivity between the piezoelectric layer 105 and the upper electrode 106. The metal layer as adhesion layer doesn't need to be oxidized.

Subsequently, an ordinary photolithographic process and an ion milling process with, e.g., inert gas (e.g., argon gas) may be used to sequentially work the upper electrode 106, the piezoelectric layer 105 and the lower electrode 104 into desired shapes. Thus, a laminated material having a section shown in FIG. 4 (*b*) can be obtained. Alternatively, a patternwise etching with an etching solution may be employed to obtain a similar laminated material.

Thereafter, as shown in FIG. 4 (*c*), a photosensitive monomer layer for the formation of polyimide is formed as a protective layer 204 for the piezoelectric layer 105 to a thickness of from 0.3 to 5 μm. The protective layer on the upper electrode 106 is then removed by development. The laminated material is then subjected to heat treatment at a temperature of from 300° C. to 450° C. to form a polyimide layer.

The subsequent operation and conditions are the same as that described with reference to the foregoing process utilizing the volume expansion due to the crystal phase transition. The material is then protected by a fixture on the piezoelectric element side thereof on which the protective layer 204 has been formed. The material is then dipped in an aqueous solution of potassium hydroxide so that single-crystal silicon substrate 101 is subjected to anisotropic etching on the opening area 203 of the silicon dioxide layer 202 to form ink chambers 102. Subsequently, the exposed area of the silicon dioxide layers 201 and 202 are etched away with an anisotropic etching solution with the single-crystal silicon substrate 101 kept fixed to the foregoing fixture.

The zirconium oxide layer 103 formed by the thermal oxidation of the metallic zirconium layer is dense and thus is useful as an etching stop layer for the silicon dioxide layer 201 during the formation of the ink chambers 102.

In the foregoing process utilizing the volume expansion due to the oxidation of metallic zirconium to zirconium oxide, the materials of the lower electrode, piezoelectric substance, upper electrode and adhesion layer may be the same as that to be used in the foregoing process utilizing the volume expansion due to the crystal phase transition, respectively.

The reason why the foregoing process utilizing the volume expansion due to the oxidation of metallic zirconium to zirconium oxide can reduce the stress applied to the foregoing single-crystal silicon substrate on the basis of the difference between the volume change of the single-crystal silicon substrate and the volume change of the lower electrode and piezoelectric layer with the heat treatment is as follows. In other words, when the single-crystal silicon substrate supporting the lower electrode and piezoelectric layer is subjected to heat treatment, the single-crystal silicon substrate and the lower electrode and piezoelectric layer show different degrees of volume expansion and shrinkage due to their different thermal expansion coefficients. For example, when cooled from high temperature to low temperature, the single-crystal silicon substrate and the lower electrode and piezoelectric layer are subjected to strong mutual stress. In some cases, the lower electrode can crack due to volume shrinkage, etc.

However, in the process according to the present invention, a metallic zirconium layer is provided interposed between the single-crystal silicon substrate and the lower electrode. In this arrangement, the metallic zirconium can be oxidized to a zirconium oxide layer at the same time with the foregoing heat treatment to cause a volume expansion that can cancel the stress produced by the difference between the volume change of the single-crystal silicon substrate and the volume change of the lower electrode and piezoelectric layer. Further, the zirconium oxide layer formed in the product as a result of the oxidation has a higher density than the zirconium oxide layer formed directly by the thin-film formation process and thus is even useful as an etching stop layer for the single-crystal silicon substrate or silicon dioxide layer.

The printer head for ink jet recording of the present invention obtained by the process of the present invention which comprises the simultaneous effectuation of a step of converting a piezoelectric precursor layer to a piezoelectric layer and a step of oxidizing metallic zirconium to zirconium oxide comprises a single-crystal silicon substrate pierced with holes; a zirconium oxide layer which is brought into direct contact with the surface of said silicon substrate or a silicon oxide layer on the surface of said silicon substrate so as to cover one end of said holes in said silicon substrate; a lower electrode provided on said zirconium oxide layer; optionally an adhesion layer provided interposed between said zirconium oxide layer and said lower electrode; a piezoelectric layer provided on said lower electrode; an upper electrode provided on said piezoelectric layer; and optionally an adhesion layer provided interposed between said piezoelectric layer and said upper electrode, wherein the thickness of said zirconium oxide layer ranges from 100 to 600 Å, preferably from 150 to 450 Å. If the thickness of the zirconium oxide layer falls below 100 Å, the adhesivity between the lower electrode and the zirconium oxide layer is reduced. On the contrary, if the thickness of the zirconium oxide layer exceeds 600 Å, the zirconium oxide layer cannot withstand the volume expansion during oxidation, causing the lower electrode to be peeled off more likely. If the thickness of the zirconium oxide layer falls within the range of from 150 to 450 Å, the probability of the peeling of the lower electrode is drastically reduced. In this case, the zirconium oxide layer doesn't need to be formed by non-stabilized zirconium oxide.

The thickness of the lower electrode is not specifically limited so far as it allows the lower electrode to act as a vibrating plate but is preferably from 0.2 to 2 μm. The thickness of the piezoelectric layer is not specifically limited so far as it allows the piezoelectric layer to fulfill its function but is preferably from 0.5 to 5 μm. The thickness of the upper electrode is not specifically limited but is preferably from 500 to 5,000 Å.

The technique of the present invention has been described with reference to printer head for ink jet recording. However, the technique of the present invention can also be generally applied to actuators. Accordingly, the present invention also relates to an actuator comprising a single-crystal silicon substrate pierced with holes, a zirconium oxide layer which is brought into direct contact with the surface of said silicon substrate or a silicon oxide layer on the surface of said silicon substrate so as to cover one end of said holes in said silicon substrate, a lower electrode provided on said zirconium oxide layer, a piezoelectric layer provided on said lower electrode, and an upper electrode provided on said piezoelectric layer. The actuator according to the present invention can also be used as microphone, sound-producing material (e.g., speaker), vibrator or oscillator, sensor, etc.

EXAMPLES

The present invention will be further described in the following examples, but the present invention should not be construed as being limited thereto.

Example 1

A printer head for ink jet recording according to the present invention was prepared by the method shown in FIG. 2. The ink chambers 102 thus formed each had a length of 100 μm in the direction of arrangement [crosswise direction as viewed on the paper] and a length of 4 mm in the direction of depth [direction perpendicular to the paper]. The piezoelectric layer was formed on the ink chambers in such an arrangement that its length in the direction of arrangement [crosswise direction as viewed on the paper] was 80 μm. The pitch of the ink chambers in the direction of arrangement was 141 μm. The resolution was 180 dpi (dot per inch).

The preparation process will be further described hereinafter in connection with FIGS. 2 (a) to (c).

A single-crystal silicon substrate 101 having (110) plane was subjected to wet thermal oxidation at a temperature of 1,200° C. to form silicon dioxide layers 201 and 202 having a thickness of 8,000 Å on both sides thereof, respectively, at the same time. Subsequently, a photoresist was formed on the silicon dioxide layer 202 to form an opening area. The silicon dioxide layer 202 was subjected to patterning with an aqueous solution containing hydrofluoric acid and ammonium fluoride to form an opening area 203. This patterning process was arranged such that the length direction of the opening area 203, i.e., direction perpendicular to the paper corresponds to <1$\bar{1}$2> direction of the single-crystal silicon substrate 101. After peeling the photoresist, a zirconium oxide layer 103 having a thickness of 1 μm was formed on the silicon dioxide layer 201 side of the silicon substrate 101 by a rf-magnetron sputtering process with a sintered product of zirconium oxide as a sputtering target. Thereafter, the material was subjected to heat treatment at a temperature of 1,100° C. in the air for 1 hour. The bending of the substrate with a zirconium oxide layer was then measured. From this value, the residual stress was calculated. As a result, it was found that the single-crystal silicon substrate 101 had been subjected to a tensile stress as small as $2\times10^{-8}$ N/m$^2$ from the zirconium oxide layer 103. The zirconium oxide layer 103 thus formed was made of a so-called non-stabilized zirconia which doesn't comprise impurities such as magnesium oxide, calcium oxide, yttrium oxide and cerium oxide incorporated therein in the form of solid solution in an amount of not less than 1 mol % so that its crystal structure stays monoclinic at room temperature.

Subsequently, a lower electrode 104 and a piezoelectric layer 105 were laminated on the zirconium oxide layer 103 to obtain a laminated material having a section shown in FIG. 2 (a).

Actually, a titanium layer was formed as an adhesion layer interposed between the zirconium oxide layer 103 and the lower electrode 104 to a thickness of 50 Å. Titanium for adhesion layer and platinum for lower electrode 104 were successively deposited by a d.c. sputtering process to a thickness of 50 Å and 2,000 Å, respectively. The piezoelectric layer 105 was formed of a ternary PZT [PbZrO$_3$-PbTiO$_3$-Pb (Mg$_{1/3}$Nb$_{2/3}$)O$_3$] to a thickness of 2 μm. In the preparation of the piezoelectric layer 105, a rf-magnetron sputtering process with a sintered product of PZT as a sputtering target was employed. The rf-magnetron sputtering was effected without heating the substrate to form an amorphous PZT precursor layer thereon. Thereafter, the material was subjected to rapid heat treatment at a temperature of 650° C. for 1 minutes and a temperature of 900° C. for 1 minute in an atmosphere of oxygen so that the amorphous PZT precursor layer was crystallized to form a piezoelectric PZT layer.

Subsequently, the piezoelectric layer 105 was patternwise etched with an aqueous solution of hydrofluoric acid. The lower electrode 104 was then patternwise etched with an aqueous solution of aqua regia. A titanium layer (thickness: 50 Å) and a metal layer as upper electrode 106 (thickness: 2,000 Å) were sequentially formed by a sputtering process. The material was then patternwise etched with an aqueous solution of iodine and potassium iodide to have a section shown in FIG. 2 (b).

Thereafter, as shown in FIG. 2 (c), a photosensitive monomer layer was formed as a protective layer 204 for the piezoelectric layer 105 to a thickness of 2 μm. The protective layer on the upper electrode 106 was then removed by development. The laminated material was then subjected to heat treatment at a temperature of 400° C. to form a polyimide layer. The material was then dipped in an aqueous solution of potassium hydroxide at a temperature of 80° C. while being protected by a polypropylene cylindrical fixture (as shown in FIG. 3 of WO93/22140) on the piezoelectric element side on which the protective layer 204 had been formed so that the single-crystal silicon substrate 101 was subjected to anisotropic etching on the opening area 203 of the silicon dioxide layer 202 to form ink chambers 102. This etching process was arranged such that the face orientation of the single-crystal silicon substrate 101 is (110) and the direction of the length of the opening area 203 is <1$\bar{1}$2> direction. Accordingly, the side wall forming the sides in the length direction of the ink chambers 102 corresponds to (111) plane. Accordingly, the degree of side etching on grooves having a depth of 250 μm in the single-crystal silicon substrate 101 could be restricted to about 1 μm.

Subsequently, the exposed area of the silicon dioxide layers 201 and 202 is etched away with an aqueous solution of hydrofluoric acid and ammonium fluoride with the single-crystal silicon substrate 101 kept fixed to the foregoing fixture. The resulting yield in production against the cracking of the zirconium oxide layer 103 as a vibrating plate was as good as 98%.

The zirconium oxide layer 103 is useful as an etching stop layer for the silicon dioxide layer 201 during the formation of the ink chambers 102. The yield in the etching process can be drastically enhanced as compared with the absence of zirconium oxide layer 103. Further, the non-stabilized zirconium oxide has a higher Young's modulus than zirconium oxide stabilized with magnesium oxide or yttrium oxide. Thus, the non-stabilized zirconium oxide can provide enhanced ink jetting properties.

In the present example, the zirconium oxide layer was made of a non-stabilized zirconium layer whose crystal structure was monoclinic. When the same procedure as mentioned above was followed except that the zirconium oxide layer was made of a partially-stabilized zirconia layer having yttrium oxide incorporated in the form of solid solution in an amount of 5 mol %, cracking occurred frequently on the thinner portion (portion formed by the zirconium oxide layer and the lower electrode) during the formation of ink chambers 102 in the single-crystal silicon substrate 101. As a result, the yield in production was as

17 poor as 30%. X-ray diffraction of crystal structure showed that the foregoing partially-stabilized zirconia layer has a monoclinic system and a cubic system in admixture.

Example 2

The procedure of Example 1 was followed to prepare various printer heads for ink jet recording except that the ratio of the thickness of the zirconium oxide layer 103 to the thickness of the lower electrode 104 (thickness of zirconium oxide layer/thickness of lower electrode) was changed in various ways. The residual stress applied to the single-crystal silicon substrate before the formation of ink chambers was measured. The yield in the production of vibrating plate was determined. Further, the head drive durability test was conducted. In some detail, the thickness of the zirconium oxide layer was changed with the thickness of the lower electrode fixed to 2,000 Å. The residual stress was calculated from the measurements of the bending of the single-crystal silicon substrate developed before the formation of ink chambers. The yield in the production of vibrating plate was judged by the presence or absence of cracking on the vibrating plate. It is represented by the % ratio of accepted products/total products. For the durability test, a pulse voltage of 30 V with a pulse width of 1 msec. was applied to the piezoelectric element $1\times10^9$ times. For the evaluation of durability, the yield was determined before and after the application of pulse voltage. The yield was judged by the presence or absence of the cracking on the lower electrode and the zirconium oxide portion. It is represented by the % ratio of accepted products/total products.

The results are set forth in Table 1 together with the results of judgement. In Table 1, the minus sign – of the residual stress indicates compression stress while the plus sign + of the residual stress indicates tensile stress.

TABLE 1

| Thickness ratio (*) | Residual stress ($\times 10^{-8}$ N/m$^2$) | Yield of vibrating plate | Yield after durability test | Judgement |
|---|---|---|---|---|
| 0.3 | −10 | 7% | 3% | No Good |
| 0.5 | −8 | 30% | 25% | No Good |
| 1.1 | −2 | 85% | 80% | Good |
| 1.8 | +1 | 90% | 85% | Good |
| 3.0 | +2 | 95% | 97% | Good |

(*: thickness of zirconium oxide layer/thickness of lower electrode)

As can be seen in Table 1, there is a correlation among the residual stress, the yield in the production of vibrating plate and the yield after durability test. In other words, if the thickness ratio (thickness of zirconium oxide layer/thickness of lower electrode) is not less than 1, the yield after durability test is generally good. The residual stress applied to the single-crystal silicon substrate falls within the range of from a weak compression stress to a weak tensile stress.

Example 3

The procedure of Example 1 was followed to prepare various printer heads for ink jet recording except that the average crystal grain diameter of the zirconium oxide constituting the zirconium oxide layer was changed in various ways. These printer heads for ink jet recording were then evaluated for durability of the head drive in the same manner as in Example 2. The results are set forth in Table 2. The crystal grain diameter was changed by properly controlling the heat treatment temperature, heat treatment time, and/or atmospheric gas in which the heat treatment is effected.

18

TABLE 2

| Average crystal grain diameter of zirconium oxide layer (Å) | Yield after durability test | Judgement |
|---|---|---|
| 200 | 2% | No Good |
| 400 | 30% | No Good |
| 500 | 68% | Good |
| 1,000 | 97% | Good |
| 3,000 | 70% | Good |
| 5,000 | 25% | No Good |

As can be seen in Table 2, if the average crystal grain diameter of the zirconium oxide layer was from 500 to 3,000 Å, the yield after durability test was good.

Example 4

The procedure of Example 1 was followed to prepare various printer heads for ink jet recording except that the temperature of the heat treatment effected after the formation of the zirconium oxide layer was changed in various ways. These printer heads for ink jet recording were then evaluated for durability of the head drive in the same manner as in Example 2. The results are set forth in Table 3.

TABLE 3

| Temperature of heat treatment effected after formation of zirconium oxide layer | Yield after durability test | Judgement |
|---|---|---|
| 900° C. | 7% | No Good |
| 1,000° C. | 32% | No Good |
| 1,050° C. | 85% | Good |
| 1,100° C. | 91% | Good |
| 1,150° C. | 95% | Excellent |
| 1,200° C. | 95% | Excellent |

The yield after durability test was relatively good at a heat treatment temperature of not lower than 1,050° C. and remarkably good at a heat treatment temperature of not lower than 1,150° C.

Example 5

In this example, the process for the formation of the zirconium oxide layer in Example 1 was changed to the following formation process.

A metallic zirconium layer was formed on the silicon dioxide layer 201 to a thickness of about 5,000 Å by a d.c. sputtering process with metallic zirconium as a sputtering target.

Subsequently, the material was subjected to heat treatment for oxidation at a predetermined temperature in a diffusion furnace in the stream of pure oxygen for 1 hour to obtain a zirconium oxide layer 104 having a thickness of 1 μm. The temperature of heat treatment for oxidation was changed in various ways to prepare various printer heads for ink jet recording which were then subjected to durability test in the same manner as in Example 2. The results are set forth in Table 4.

TABLE 4

| Temperature of oxidation of metallic zirconium | Yield after durability test | Judgement |
|---|---|---|
| 900° C. | 3% | No Good |
| 1,000° C. | 25% | No Good |

TABLE 4-continued

| Temperature of oxidation of metallic zirconium | Yield after durability test | Judgement |
|---|---|---|
| 1,050° C. | 80% | Good |
| 1,100° C. | 82% | Good |
| 1,150° C. | 91% | Excellent |
| 1,200° C. | 92% | Excellent |

The oxidation of zirconium begins at about 300° C. All the layers oxidized at the oxidizing temperatures shown in FIG. 4 were monoclinic zirconium oxide layers.

As can be seen in Table 4, it is relatively preferred that the oxidizing temperature of metallic zirconium be not lower than 1,050° C. If the oxidizing temperature is not lower than 1,150° C., remarkably excellent results were obtained.

The zirconium oxide layer formed by thermal oxidation was more dense than that obtained by the process for the preparation of zirconium oxide layer described in Example 1. Thus, this zirconium oxide layer can act as a good etching stop layer during the formation of ink chambers. This zirconium oxide layer also gives a higher Young's modulus that enhances the ink jetting properties.

Example 6

A printer head for ink jet recording according to the present invention was prepared by the method shown in FIG. 3. The ink chambers 102 thus formed each had a length of 100 μm in the direction of arrangement [crosswise direction as viewed on the paper] and a length of 4 mm in the direction of depth [direction perpendicular to the paper]. The piezoelectric layer was formed on the ink chambers in such an arrangement that its length in the direction of arrangement [crosswise direction as viewed on the paper] was 80 μm. The pitch of the ink chambers in the direction of arrangement was 141 μm. The resolution was 180 dpi (dot per inch).

The preparation process will be further described hereinafter in connection with FIG. 4. In the section view of FIG. 4, the direction perpendicular to the paper corresponds to the length of the ink chambers.

A single-crystal silicon substrate 101 having a thickness of 220 μm and having (110) plane was subjected to wet thermal oxidation at a temperature of 1,100° C. to form silicon dioxide layers 201 and 202 having a thickness of 0.8 μm on both sides thereof, respectively, at the same time.

Subsequently, a photoresist was formed on both sides of the silicon dioxide layers 201 and 202 by an ordinary photolithographic process. A desired pattern was then formed on the photoresist on the silicon dioxide layer 202.

This substrate was then dipped in an aqueous solution of hydrofluoric acid and ammonium fluoride so that the silicon dioxide layer 202 was patternwise etched to form an opening area 203. This etching process was arranged such that the length direction of the opening area 203, i.e., direction perpendicular to the paper corresponds to <1$\bar{1}$2> direction of the single-crystal silicon substrate 101.

This substrate was then dipped in sulfuric acid at a temperature of 80° C. to remove the photoresist. A metallic zirconium layer 103 was then formed on the silicon dioxide layer 201 side of the silicon substrate 101 to a thickness of 200 Å by a d.c. sputtering process. Subsequently, a platinum layer was formed as a lower electrode 104 to a thickness of 0.8 μm by a d.c. sputtering process. Further, a ternary PZT [$PbZrO_3$-$PbTiO_3$-$Pb(Mg_{1/3}Nb_{2/3})O_3$] was deposited as a piezoelectric layer 105 to a thickness of 2 μm. In the process for the preparation of the piezoelectric layer 105, a rf-magnetron sputtering process with a sintered product of PZT as a sputtering target was employed. The rf-magnetron sputtering was effected without heating the substrate to form an amorphous PZT precursor layer thereon. Thereafter, the material was subjected to heat treatment at a temperature of 750° C. for 1 minutes in an atmosphere of oxygen so that the amorphous PZT precursor layer was crystallized to form a piezoelectric PZT layer. At the same time, during this heat treatment, the metallic zirconium layer 103 was oxidized to a zirconium oxide layer whose thickness was as twice (400 Å) as that of the metallic zirconium layer 103. Subsequently, a metal was deposited as an upper electrode 106 on the piezoelectric layer 105 to a thickness of 0.1 μm by a d.c. sputtering process.

Subsequently, an ordinary photolithographic process and an ion milling process with argon gas were used to sequentially work the upper electrode 106, the piezoelectric layer 105 and the lower electrode 104 into desired shapes. Thus, a laminated material having a section shown in FIG. 4 (b) was obtained.

Thereafter, as shown in FIG. 4 (c), a photosensitive monomer layer was formed as a protective layer 204 for the piezoelectric layer 105 to a thickness of 2 μm. The protective layer on the upper electrode 106 was then removed by development. The laminated material was then subjected to heat treatment at a temperature of 400° C. to form a polyimide layer. The material was then dipped in an aqueous solution of potassium hydroxide at a temperature of 80° C. while being protected by the same fixture as used in Example 1 on the piezoelectric element side on which the protective layer 204 had been formed so that the single-crystal silicon substrate 101 was subjected to anisotropic etching on the opening area 203 of the silicon dioxide layer 202 to form ink chambers 102. This etching process was arranged such that the face orientation of the single-crystal silicon substrate 101 is (110) and the direction of the length of the opening area 203 is <1$\bar{1}$2> direction. Accordingly, the side wall forming the sides in the length direction of the ink chambers 102 corresponds to (111) plane. Thus, the degree of side etching on grooves having a depth of 220 μm in the single-crystal silicon substrate 101 could be restricted to about 0.8 μm.

Subsequently, the exposed area of the silicon dioxide layers 201 and 202 is etched away with an aqueous solution of hydrofluoric acid and ammonium fluoride with the single-crystal silicon substrate 101 kept fixed to the foregoing fixture.

As a result, a printer head for ink jet recording having a good adhesivity between the silicon substrate and the zirconium oxide layer and between the zirconium oxide layer and the lower electrode and free from layer peeling was prepared. The printer head was then subjected to durability test in the same manner as in Example 2. The resulting yield in production was as high as not less than 80%.

Example 7

Figure 5:
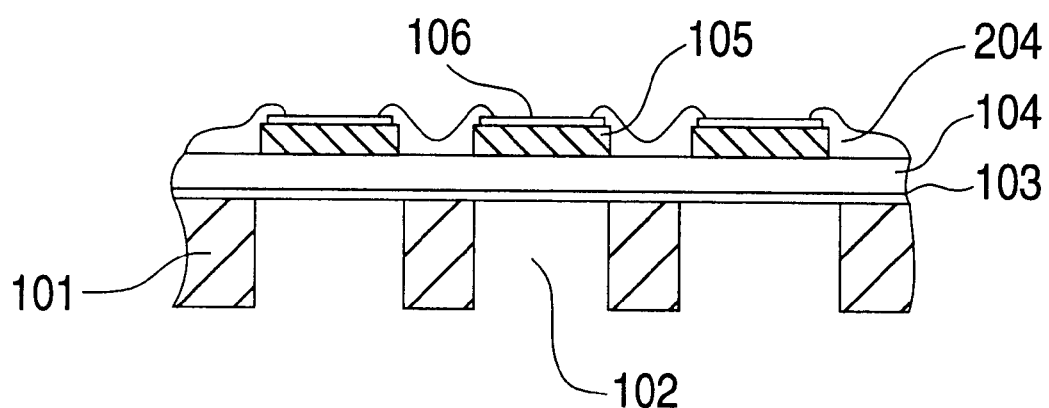
FIG. 5 is a sectional view illustrating the main part of another embodiment of the printer head for ink jet recording according to the present invention.

In this example, a metallic zirconium layer 103 was formed directly on the single-crystal silicon substrate 101 without interposing any silicon dioxide layer as shown in FIG. 5.

The preparation process will be further described in connection with FIGS. 6 (a), (b) and (c).

Figure 6:
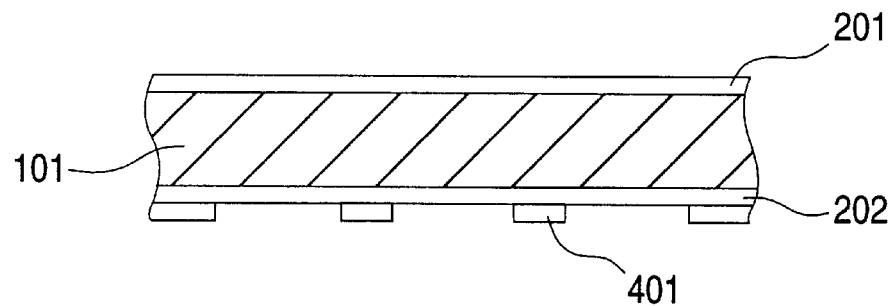
FIGS. 6(a), 6(b) and 6(c) are sectional views illustrating the process for the preparation of the main part of the printer head for ink jet recording according to the present invention shown in FIG. 5.
Figure 6:
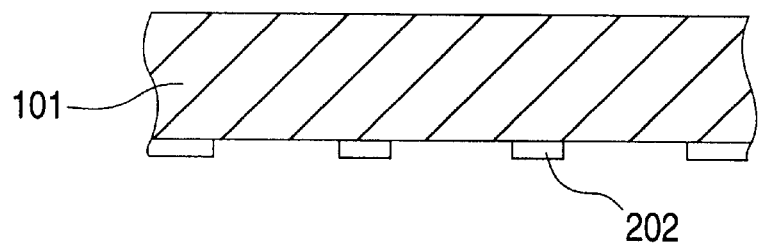
Figure 6:
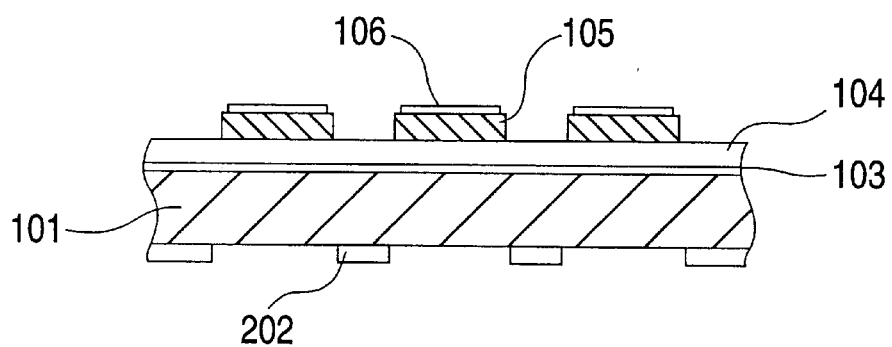

As shown in FIG. 6 (a), silicon dioxide layers 201 and 202 were formed on both sides of the single-crystal silicon substrate 101 in the same manner as in Example 6. A photoresist 401 was patternwise formed only on the silicon dioxide layer 202 by an ordinary photolithographic process. The substrate on which the foregoing photoresist had been patternwise formed was then dipped in an aqueous solution of hydrofluoric acid and ammonium fluoride so that the silicon dioxide layer 201 was entirely etched away while the silicon dioxide layer 202 was patternwise etched.

Thereafter, the photoresist 401 was stripped off with sulfuric acid at a temperature of 80° C. as shown in FIG. 6 (b). Subsequently, as shown in FIG. 6 (c), a zirconium oxide layer 103, a lower electrode 104, a piezoelectric layer 105, and an upper electrode 106 were subsequently formed.

Finally, ink chambers 102 and a protective layer 204 were formed in the same manner as in Example 6 to obtain a structure shown in FIG. 5.

As a result, a printer head for ink jet recording having a good adhesivity between the silicon substrate and the zirconium oxide layer and between the zirconium oxide layer and the lower electrode and free from layer peeling was prepared. The printer head was then subjected to durability test in the same manner as in Example 2. The resulting yield in production was as high as not less than 80%.

Example 8

The procedure of Example 6 was followed to prepare elements except that the thickness of the metallic zirconium layer was changed in various ways. The yield of these elements were then evaluated.

The lower electrode and the piezoelectric layer were formed by depositing platinum and a ternary PZT (same as used in Example 6) to a thickness of 0.8 $\mu$m and 1.5 $\mu$m, respectively. The quality of these elements was evaluated by the adhesivity of the lower electrode after the heat treatment for crystallization of PZT. The chips which show peeling or floating on the lower electrode were regarded as defective. The borderline between acceptance and rejection was a yield of 50%. The results are set forth in Table 5.

TABLE 5

| Thickness of metallic zirconium layer (Å) | Thickness of zirconium oxide layer (Å) | % Yield | Judgement |
|---|---|---|---|
| 0 | 0 | 0 | No Good |
| 25 | 50 | 4 | No Good |
| 50 | 100 | 63 | Good |
| 100 | 200 | 80 | Good |
| 200 | 400 | 85 | Good |
| 300 | 600 | 56 | Good |
| 400 | 800 | 27 | No Good |
| 500 | 1,000 | 0 | No Good |

In all the samples, the thickness of the metallic zirconium layer was doubled by the heat treatment.

The results of the foregoing experiment show that the preferred thickness of the zirconium oxide layer ranges from 100 to 600 Å.

The same experimental procedure as mentioned above was followed except that the thickness of the lower electrode was from 0.2 to 2 $\mu$m and the thickness of PZT piezoelectric layer was from 0.5 to 5 $\mu$m. As a result, the preferred thickness of the zirconium oxide layer was found to range from 100 to 600 Å as mentioned above.

When a metallic zirconium layer having a thickness of 200 Å was previously subjected to thermal oxidation followed by the subsequent formation of a lower electrode and a PZT layer which was then subjected to heat treatment for crystallization, the adhesivity between the lower electrode and the zirconium oxide layer was extremely poor, causing the lower electrode to be entirely peeled off the zirconium oxide layer.

In this example, a structure comprising a silicon dioxide layer was used. The same experiment as mentioned above was made on the structure free of silicon dioxide layer shown in Example 7. As a result, the preferred thickness of the zirconium oxide layer was found to range from 100 to 600 Å.

Example 9

The procedure of Example 8 was followed to prepare elements except that an adhesion layer was further provided interposed between the metallic zirconium layer and the lower electrode.

When titanium, tantalum, aluminum or tin was used as a metal for the adhesion layer, the adhesivity was enhanced, giving a yield rise of from 1 to 5 points.

These adhesion layers were subjected to X-ray analysis. As a result, it was found that these adhesion layers were all oxides. In particular, the adhesion layer made of tantalum was found to comprise an alloy of tantalum oxide with lead tantalum oxide produced by the reaction of lead diffused from PZT with part of the tantalum layer.

If iridium was used as a metal for adhesion layer, the resulting adhesivity was particularly high, giving a yield rise of from 7 to 10 points, probably because iridium belongs to the same group as the lower electrode metal, i.e., platinum group.

In Examples 6 to 9, experiments were done at a PZT crystallizing heat treatment temperature of 750° C. The optimum heat treatment temperature at which a high piezoelectricity can be obtained varies with the composition of PZT used. Experiments were done at various heat treatment temperatures in the range of from 650° C. to 850° C. As a result, when the zirconium oxide layer having a thickness falling within the foregoing preferred range was used, the resulting adhesivity of the lower electrode had no problems.

In the present invention, by providing a monoclinic zirconium oxide layer or metallic zirconium layer interposed between a single-crystal silicon substrate and a lower electrode in the preparation of a printer head for ink jet recording, the stress applied to the single-crystal silicon substrate due to the difference between the volume change of the single-crystal silicon substrate and the volume change of the lower electrode and the piezoelectric layer with the temperature change due to the heat treatment in the preparation process can be reduced by the volume expansion of said monoclinic zirconium oxide layer due to the crystalline phase transition or the oxidation of zirconium to zirconium oxide. Accordingly, the printer head for ink jet recording according to the present invention is insusceptible to cracking on a vibrating plate made of the monoclinic zirconium oxide layer and thus can provide a printer head for ink jet recording having an excellent durability. Further, a piezoelectric thin film element having a high piezoelectricity can be integrally formed, making it possible to a printer head for ink jet recording having excellent ink jetting properties at a low cost.

While the invention has been described in detail and with reference to specific embodiments thereof, it will be apparent to one skilled in the art that various changes and modifications can be made therein without departing from the spirit and scope thereof.

What is claimed is:

1. A printer head for ink jet recording comprising:

a single-crystal silicon substrate pierced with holes, a zirconium oxide layer which is brought into direct contact with the surface of said silicon substrate so as to cover one end of said holes in said silicon substrate and where the zirconium oxide has a crystal structure which stays monoclinic at room temperature, a lower electrode provided on said zirconium oxide layer, a piezoelectric layer provided on said lower electrode, and an upper electrode provided on said piezoelectric layer.

2. The printer head for ink jet recording according to claim 1, wherein said zirconium oxide layer has a thickness greater than that of said lower electrode.

3. The printer head for ink jet recording according to claim 1 or 2, wherein said zirconium oxide layer has an average crystal grain diameter of from 500 to 3,000 Å.

4. The printer head for ink jet recording according to claim 1, wherein said zirconium oxide layer has a thickness of from 100 to 600 Å.

5. The printer head for ink jet recording according to claim 4, wherein said piezoelectric layer has a thickness of from 0.5 to 5 µm.

6. The printer head for ink jet recording according to claim 1, wherein said piezoelectric layer is a lead zirconate titanate (PZT) layer.

7. The printer head for ink jet recording according to claim 6, wherein said piezoelectric layer is a ternary lead zirconate titanate (PZT) layer containing a third component in an amount of not less than 5 mol %.

8. The printer head for ink jet recording according to claim 1, wherein said lower electrode is made of a material comprising platinum or palladium as a main component.

9. The printer head for ink jet recording according to claim 1, further comprising an adhesion layer interposed between said zirconium oxide layer and said lower electrode.

10. The printer head for ink jet recording according to claim 9, wherein said adhesion layer is made of a metal oxide.

11. The printer had for ink jet recording according to claim 10, wherein said metal oxide is titanium oxide, tantalum oxide, aluminum oxide, tin oxide, tantalum lead oxide, iridium oxide or mixture thereof.

12. The printer head for ink jet recording according to claim 1, wherein said lower electrode, said piezoelectric layer and said upper electrode were formed by a tin-film formation process.

13. The printer head for ink jet recording according to claim 1, wherein said zirconium oxide is non-stabilized zirconium oxide.

14. A printer head for ink jet recording comprising:

a single-crystal silicon substrate pierced with holes, a zirconium oxide layer which is brought into direct contact with a silicon oxide layer on the surface of said silicon substrate so as to cover one end of said holes in said silicon substrate and where the zirconium oxide has a crystal structure which stays monoclinic at room temperature, a lower electrode provided on said zirconium oxide layer, a piezoelectric layer provided on said lower electrode, and an upper electrode provided on said piezoelectric layer.

15. The printer head for ink jet recording according to claim 14, wherein said zirconium oxide layer has a thickness greater than that of said lower electrode.

16. The printer head for ink jet recording according to claim 14, wherein said zirconium oxide layer has an average crystal grain diameter of from 500 to 3,000 Å.

17. The printer head for ink jet recording according to claim 14, wherein said zirconium oxide layer has a thickness of from 100 to 600 Å.

18. The printer head for ink jet recording according to claim 17, wherein said piezoelectric layer has a thickness of from 0.5 to 5 µm.

19. The printer head for ink jet recording according to claim 14, wherein said piezoelectric layer is a lead zirconate titanate (PZT) layer.

20. The printer head for ink jet recording according to claim 19, wherein said piezoelectric layer is a ternary lead zirconate titanate (PZT) layer containing a third component in an amount of not less than 5 mol %.

21. The printer head for ink jet recording according to claim 14, wherein said lower electrode is made of a material comprising platinum or palladium as a main component.

22. The printer head for ink jet recording according to claim 14, further comprising an adhesion layer interposed between said zirconium oxide layer and said lower electrode.

23. The printer head for ink jet recording according to claim 22, wherein said adhesion layer is made of metal oxide.

24. The printer head for ink jet recording according to claim 23, wherein said metal oxide titanium oxide, tantalum oxide, aluminum oxide, tin oxide, tantalum lead oxide, iridium oxide or mixture thereof.

25. The printer head for ink jet recording according to claim 14, wherein said lower electrode, said piezoelectric layer and said upper electrode were formed by a thin-film formation process.

26. The printer head for ink jet recording according to claim 14, wherein said zirconium oxide is non-stabilized zirconium oxide.

* * * * *